(12) United States Patent
Takeuchi et al.

(10) Patent No.: US 11,945,886 B2
(45) Date of Patent: Apr. 2, 2024

(54) CURED RESIN FORMATION METHOD AND CURED RESIN FORMATION DEVICE

(71) Applicant: FUJI CORPORATION, Chiryu (JP)

(72) Inventors: Tasuku Takeuchi, Kariya (JP); Ryojiro Tominaga, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 59 days.

(21) Appl. No.: 17/630,850

(22) PCT Filed: Jul. 31, 2019

(86) PCT No.: PCT/JP2019/029992
§ 371 (c)(1),
(2) Date: Jan. 27, 2022

(87) PCT Pub. No.: WO2021/019718
PCT Pub. Date: Feb. 4, 2021

(65) Prior Publication Data
US 2022/0298267 A1 Sep. 22, 2022

(51) Int. Cl.
*C08F 2/48* (2006.01)
(52) U.S. Cl.
CPC ..................... *C08F 2/48* (2013.01)
(58) Field of Classification Search
None
See application file for complete search history.

(56) References Cited

U.S. PATENT DOCUMENTS

| | | | |
|---|---|---|---|
| 10,462,909 B2 | 10/2019 | Tsukada et al. | |
| 2018/0302991 A1* | 10/2018 | Tsukada | B29C 64/336 |
| 2019/0047185 A1 | 2/2019 | Kritchman et al. | |

FOREIGN PATENT DOCUMENTS

| | | | | |
|---|---|---|---|---|
| JP | 2000180619 A | * | 6/2000 | |
| JP | 2001026052 A | * | 1/2001 | ........... B29C 43/021 |
| JP | 2001356211 A | * | 12/2001 | |
| JP | 2003017391 A | * | 1/2003 | ........... G03F 7/2024 |
| JP | 3934841 B2 | * | 6/2007 | |
| JP | 2008106152 A | * | 5/2008 | |
| JP | 2013-67016 A | | 4/2013 | |
| JP | 2014-221538 A | | 11/2014 | |
| WO | WO 2016/075823 A1 | | 5/2016 | |
| WO | WO 2017/221347 A1 | | 12/2017 | |

OTHER PUBLICATIONS

International Search Report dated Oct. 8, 2019 in PCT/JP2019/029992 filed on Jul. 31, 2019, 2 pages.

* cited by examiner

*Primary Examiner* — Sanza L. McClendon
(74) *Attorney, Agent, or Firm* — Oblon, McClelland, Maier & Neustadt, L.L.P.

(57) ABSTRACT

A cured resin formation method including an applying step of applying an ultraviolet curable resin on a base; and a curing step of curing the ultraviolet curable resin by irradiating the ultraviolet curable resin applied in the applying step with ultraviolet rays, in which in the curing step, the ultraviolet curable resin is irradiated with ultraviolet rays while cooling the ultraviolet curable resin, so that a difference between an ordinary temperature of the ultraviolet curable resin and a temperature of the ultraviolet curable resin when irradiated with ultraviolet rays is within a set temperature difference set in advance.

4 Claims, 7 Drawing Sheets

US 11,945,886 B2

CURED RESIN FORMATION METHOD AND CURED RESIN FORMATION DEVICE

TECHNICAL FIELD

The present disclosure relates to a cured resin formation method and a cured resin formation device that cures an ultraviolet curable resin by irradiating the ultraviolet curable resin with ultraviolet rays.

BACKGROUND ART

As described in the following Patent Literature, a technique for curing an ultraviolet curable resin to form a shaped object by irradiating the ultraviolet curable resin with ultraviolet rays has been developed.

PATENT LITERATURE

Patent Literature 1: JP-A-2013-67016

BRIEF SUMMARY

Technical Problem

It is an object of the present specification to appropriately form a shaped object with an ultraviolet curable resin.

Solution to Problem

In order to solve the above-described problems, the present specification discloses a cured resin formation method including an applying step of applying an ultraviolet curable resin on a base; and a curing step of curing the ultraviolet curable resin by irradiating the ultraviolet curable resin applied in the applying step with ultraviolet rays, in which in the curing step, the ultraviolet curable resin is irradiated with ultraviolet rays while cooling the ultraviolet curable resin, so that a difference between an ordinary temperature of the ultraviolet curable resin and a temperature of the ultraviolet curable resin when irradiated with ultraviolet rays is within a set temperature difference set in advance.

In addition, in order to solve the above-described problems, the present specification discloses a cured resin formation device including an applying device configured to apply an ultraviolet curable resin on a base; and an irradiation device configured to cure the ultraviolet curable resin by irradiating the ultraviolet curable resin applied by the applying device with ultraviolet rays, in which the irradiation device irradiates the ultraviolet curable resin with ultraviolet rays while cooling the ultraviolet curable resin so that a difference between an ordinary temperature of the ultraviolet curable resin and a temperature of the ultraviolet curable resin when irradiated with ultraviolet rays is within a set temperature difference set in advance.

Advantageous Effects

In the present disclosure, the ultraviolet curable resin is irradiated with ultraviolet rays while the ultraviolet curable resin is cooled so that the difference between the ordinary temperature of the ultraviolet curable resin and the temperature of the ultraviolet curable resin when irradiated with ultraviolet rays is within the set temperature difference set in advance. As a result, it is possible to suppress an increase in the temperature of the ultraviolet curable resin, and a shaped object can be appropriately formed with the ultraviolet curable resin.

DESCRIPTION OF EMBODIMENTS

Hereinafter, as exemplary embodiments of the present disclosure, an embodiment of the present disclosure is described in detail with reference to the drawings.

Figure 1:
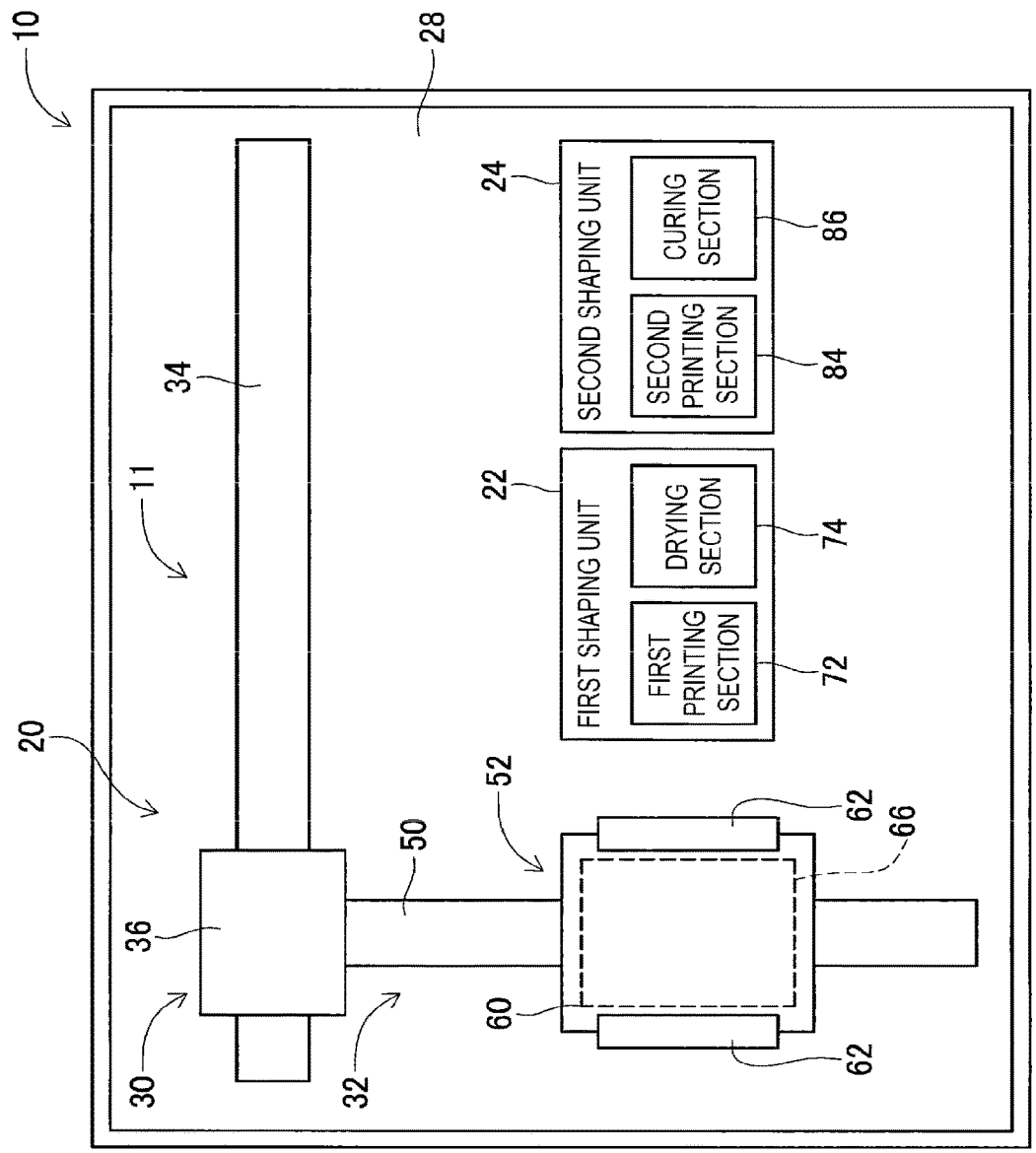
FIG. 1 is a diagram illustrating a circuit formation device.

FIG. 1 illustrates circuit formation device 10. Circuit formation device 10 is provided with conveyance device 20, first shaping unit 22, second shaping unit 24, and control device 26 (refer to FIG. 2). Conveyance device 20, first shaping unit 22, and second shaping unit 24 are disposed on base 28 of circuit formation device 10. Base 28 has a substantially rectangular shape, and in the following description, the longitudinal direction of base 28 will be referred to as the X-axis direction, the shorter direction of base 28 will be referred to as the Y-axis direction, and the direction orthogonal to both the X-axis direction and the Y-axis direction will be referred to as the Z-axis direction.

Conveyance device 20 is provided with X-axis slide mechanism 30 and Y-axis slide mechanism 32. X-axis slide mechanism 30 includes X-axis slide rail 34 and X-axis slider 36. X-axis slide rail 34 is disposed on base 28 so as to extend in the X-axis direction. X-axis slider 36 is held by X-axis slide rail 34 so as to be slidable in the X-axis direction. Furthermore, X-axis slide mechanism 30 includes electromagnetic motor (refer to FIG. 2) 38, and moves X-axis slider 36 to any position in the X-axis direction by driving electromagnetic motor 38. In addition, Y-axis slide mechanism 32 includes Y-axis slide rail 50 and stage 52. Y-axis slide rail 50 is disposed on base 28 so as to extend in the Y-axis direction and is movable in the X-axis direction. One end portion of Y-axis slide rail 50 is coupled to X-axis slider 36. Stage 52 is held on Y-axis slide rail 50 to be slidable in the Y-axis direction. Furthermore, Y-axis slide mechanism 32 includes electromagnetic motor (refer to FIG. 2) 56, and stage 52 moves to any position in the Y-axis direction by driving electromagnetic motor 56. As a result, by driving X-axis slide mechanism 30 and Y-axis slide mechanism 32, stage 52 is moved to any position on base 28

Stage 52 includes base plate 60, holding device 62, lifting and lowering device (refer to FIG. 2) 64, and cooling device 66. Base plate 60 is formed in a flat plate shape, and a board is placed on an upper surface of base plate 60. Holding devices 62 are provided on both side portions of base plate 60 in the X-axis direction. The board placed on base plate 60 is fixedly held by interposing both edge portions of the board in the X-axis direction with holding devices 62. In addition, lifting and lowering device 64 is disposed below base plate 60, and lifts and lowers base plate 60. Furthermore, cooling device 66 is disposed inside base plate 60 to cool base plate 60 to a predetermined temperature.

First shaping unit 22 is a unit for shaping wiring on board 70 (refer to FIG. 3) placed on base plate 60 of stage 52, and includes first printing section 72 and drying section 74. First printing section 72 includes ink jet head 76 (refer to FIG. 2), and discharges metal ink linearly on board 70 placed on base plate 60. Metal ink is ink in which fine metal particles are dispersed in a solvent. Ink jet head 76 discharges a conductive material from multiple nozzles, for example, by a piezo method using a piezoelectric element.

Figure 2:
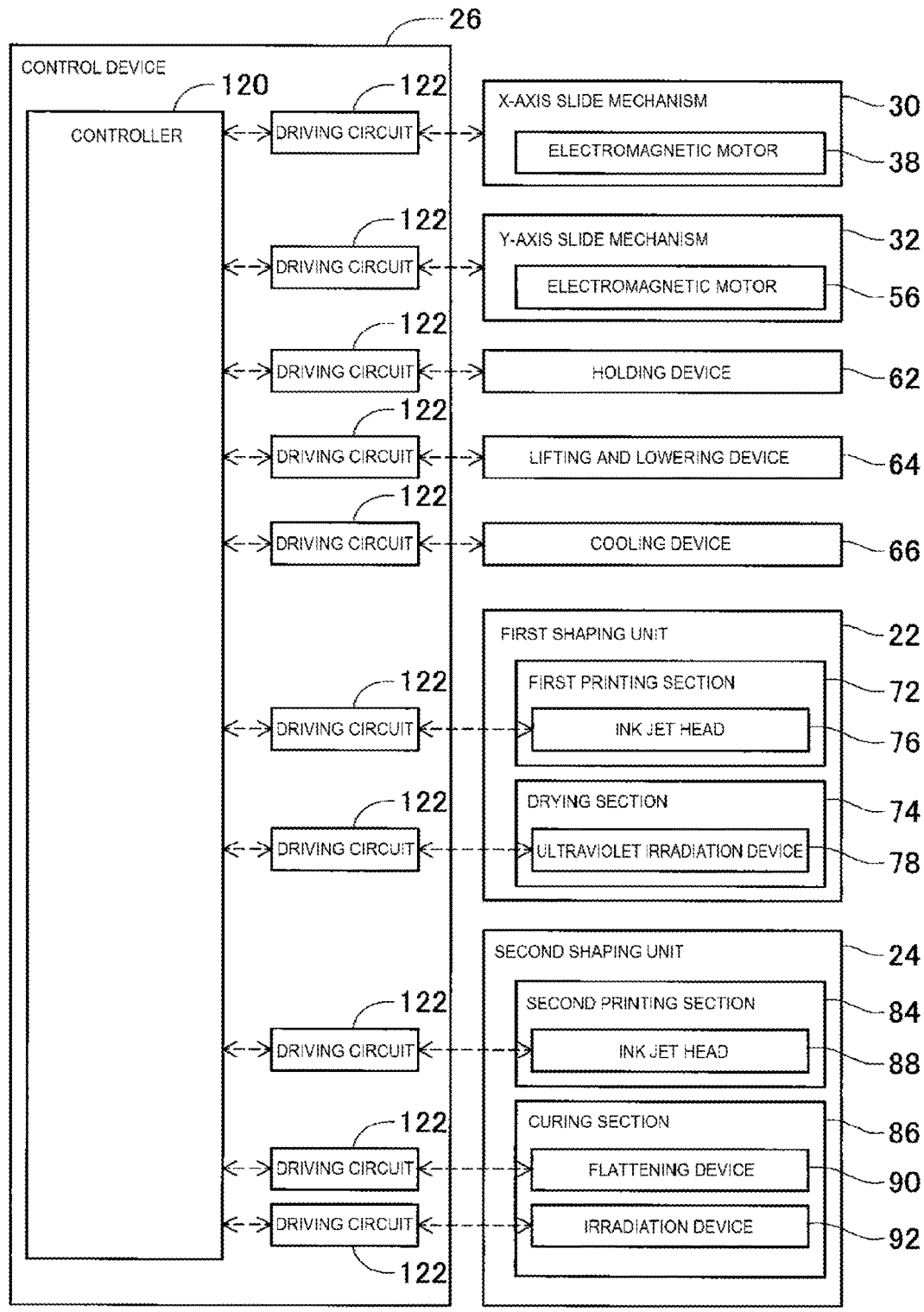
FIG. 2 is a block diagram illustrating a control device of the circuit formation device.

Drying section 74 includes ultraviolet irradiation device 78 (refer to FIG. 2). Ultraviolet irradiation device 78 is a device for irradiating the metal ink discharged on board 70 with ultraviolet rays, and the metal ink is dried by irradiating with ultraviolet rays. At this time, the solvent is vaporized by the drying of the metal ink, and the metal fine particles contact or aggregate with each other, and thus metal wiring is formed.

In addition, second shaping unit 24 is a unit for shaping a resin layer on board 70 placed on base plate 60 of stage 52, and includes second printing section 84 and curing section 86. Second printing section 84 includes ink jet head 88 (refer to FIG. 2), and discharges the ultraviolet curable resin onto board 70 placed on base plate 60. Ink jet head 88 may be, for example, a piezo method using a piezoelectric element, or may be a thermal method in which a resin is heated to generate air bubbles and discharged from a nozzle.

Curing section 86 includes flattening device (refer to FIG. 2) 90 and irradiation device (refer to FIG. 2) 92. Flattening device 90 is a device for flattening an upper surface of the ultraviolet curable resin discharged on board 70 by ink jet head 88, and makes the thickness of the ultraviolet curable resin uniform, for example, by scraping off excess resin by a roller or a blade while leveling the surface of the ultraviolet curable resin. In addition, irradiation device 92 is provided with a mercury lamp or LED as a light source, and irradiates the ultraviolet curable resin discharged on board 70 with ultraviolet rays. As a result, the ultraviolet curable resin discharged on board 70 is cured, and a resin layer is shaped.

In addition, as illustrated in FIG. 2, control device 26 is provided with controller 120 and multiple drive circuits 122. Multiple drive circuits 122 are connected to above electromagnetic motors 38 and 56, holding device 62, lifting and lowering device 64, cooling device 66, ink jet head 76, ultraviolet irradiation device 78, ink jet head 88, flattening device 90, and irradiation device 92. Controller 120 is provided with CPU, ROM, RAM, and the like, and is mainly a computer, and is connected to multiple drive circuits 122. As a result, the operations of conveyance device 20, first shaping unit 22, and second shaping unit 24 are controlled by controller 120.

Figure 3:
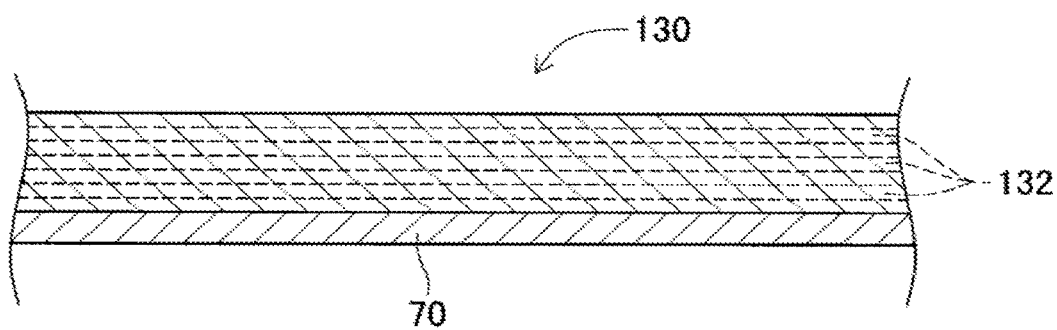
FIG. 3 is a cross-sectional view illustrating a circuit in a state where a resin laminate is formed.

In circuit formation device 10, a circuit pattern is formed on board 70 by the above-described configuration. Specifically, board 70 is set on base plate 60 of stage 52, and stage 52 is moved below second shaping unit 24. In second shaping unit 24, resin laminate 130 is formed on board 70 as illustrated in FIG. 3. Resin laminate 130 is formed by repeating discharge of the ultraviolet curable resin from ink jet head 88 and irradiation of the discharged ultraviolet curable resin with ultraviolet rays by irradiation device 92.

More specifically, in second printing section 84 of second shaping unit 24, ink jet head 88 discharges the ultraviolet curable resin in a thin film shape onto an upper surface of board 70. Subsequently, when the ultraviolet curable resin is discharged in a thin film shape, the ultraviolet curable resin is flattened by flattening device 90 in curing section 86, so that the ultraviolet curable resin has a uniform film thickness. Irradiation device 92 irradiates the thin film-shaped ultraviolet curable resin with ultraviolet rays. As a result, thin film-shaped resin layer 132 is formed on board 70.

Subsequently, ink jet head 88 discharges the ultraviolet curable resin in a thin film shape onto thin film-shaped resin layer 132. The thin film-shaped ultraviolet curable resin is flattened by flattening device 90, irradiation device 92 irradiates the ultraviolet curable resin discharged in a thin film shape with ultraviolet rays, and thus thin film-shaped resin layer 132 is laminated on thin film-shaped resin layer 132. As described above, the discharge of the ultraviolet curable resin onto thin film-shaped resin layer 132 and the irradiation of ultraviolet rays are repeated, and multiple resin layers 132 are laminated, and thus resin laminate 130 is formed.

Figure 4:
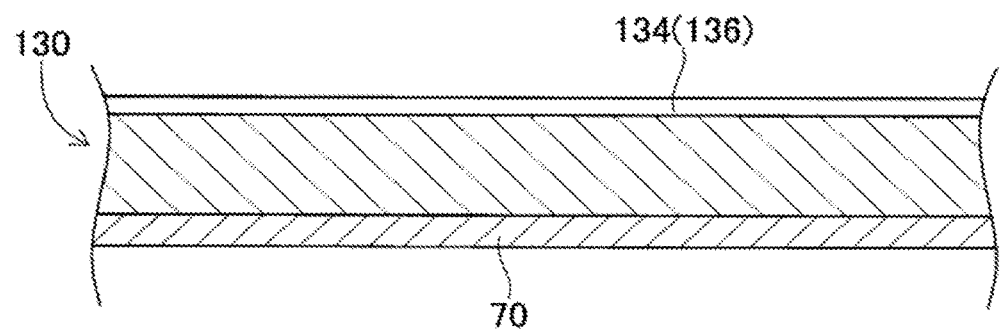
FIG. 4 is a cross-sectional view illustrating the circuit in a state where wiring is formed on the resin laminate.

When resin laminate 130 is formed by the above-described procedure, stage 52 is moved below first shaping unit 22. In first printing section 72, as illustrated in FIG. 4, ink jet head 76 linearly discharges metal ink 134 on the upper surface of resin laminate 130 in accordance with the circuit pattern. Next, in drying section 74 of first shaping unit 22, ultraviolet irradiation device 78 irradiates metal ink 134 with ultraviolet rays. As a result, metal ink 134 is dried, and wiring 136 is formed on resin laminate 130.

As described above, in circuit formation device 10, resin laminate 130 is formed by curing the ultraviolet curable resin, and wiring 136 is formed by drying the metal ink, and thus the circuit pattern is formed on board 70. Each of multiple resin layers 132 to be laminated when forming resin laminate 130 is formed by curing the thin film-shaped ultraviolet curable resin by irradiating the ultraviolet curable resin applied in a thin film shape with ultraviolet rays having a required integrated amount of light, which is the amount of light required to cure the ultraviolet curable resin. At this time, when resin laminate 130 in the conventional art is formed, resin layer 132 is formed by irradiating the thin film-shaped ultraviolet curable resin with ultraviolet rays having a required integrated amount of light at once. That is, the thin film-shaped ultraviolet curable resin is cured by irradiating the thin film-shaped ultraviolet curable resin with ultraviolet rays once, and thus resin layer 132 is formed.

As described above, when the ultraviolet ray having the required integrated amount of light is irradiated to the ultraviolet curable resin at once, the curing reaction of the ultraviolet curable resin proceeds at once, and high reaction heat is generated. In addition, when the ultraviolet curable resin absorbs ultraviolet rays having a required integrated amount of light, high absorption heat is also generated. Therefore, the ultraviolet curable resin is heated to a high temperature, and resin layer 132 having a high temperature is formed. In addition, as the temperature of the ultraviolet curable resin rises, board 70 to which the ultraviolet curable resin is applied also reaches a high temperature. After resin layer 132 is formed, in a process in which the temperature between resin layer 132 and board 70 that are at a high temperature is reduced, there is a possibility that resin layer 132 is warped due to the difference in shrinkage between resin layer 132 and board 70. At this time, the difference in shrinkage between resin layer 132 and board 70 is significantly affected by the difference in the expansion coefficient of resin layer 132 and the expansion coefficient of board 70, and the temperature difference of the ultraviolet curable resin when irradiated with ultraviolet rays.

The expansion coefficient indicates the ratio per unit temperature at which the object expands as the temperature of the object increases, and is also referred to as a coefficient of thermal expansion. For example, the elongation rate of the length due to the expansion of the object per unit temperature is referred to as a linear coefficient of thermal expansion, and the increase rate of the volume due to the expansion of the object per unit temperature is referred to as a volume coefficient of thermal expansion. The larger the difference between the expansion coefficient of resin layer 132 and the expansion coefficient of board 70, the larger the difference in shrinkage between resin layer 132 and board 70 when the temperature is reduced between resin layer 132 and board 70, and thus there is a possibility that a large warp may occur in resin layer 132.

Figure 5:
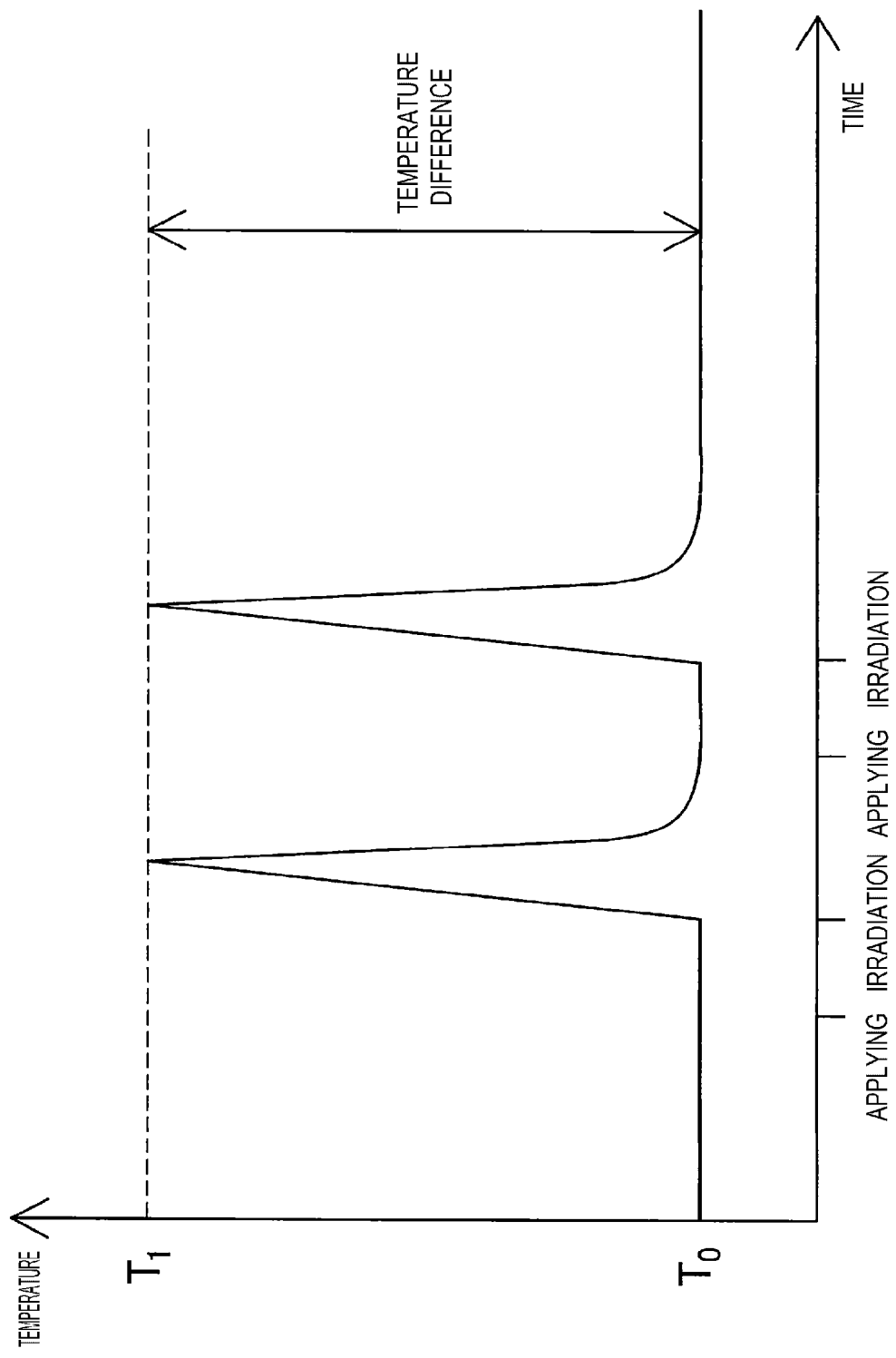
FIG. 5 is a graph illustrating a temperature change of an ultraviolet curable resin when a resin laminate is formed by a method in the conventional art.
Figure 6:
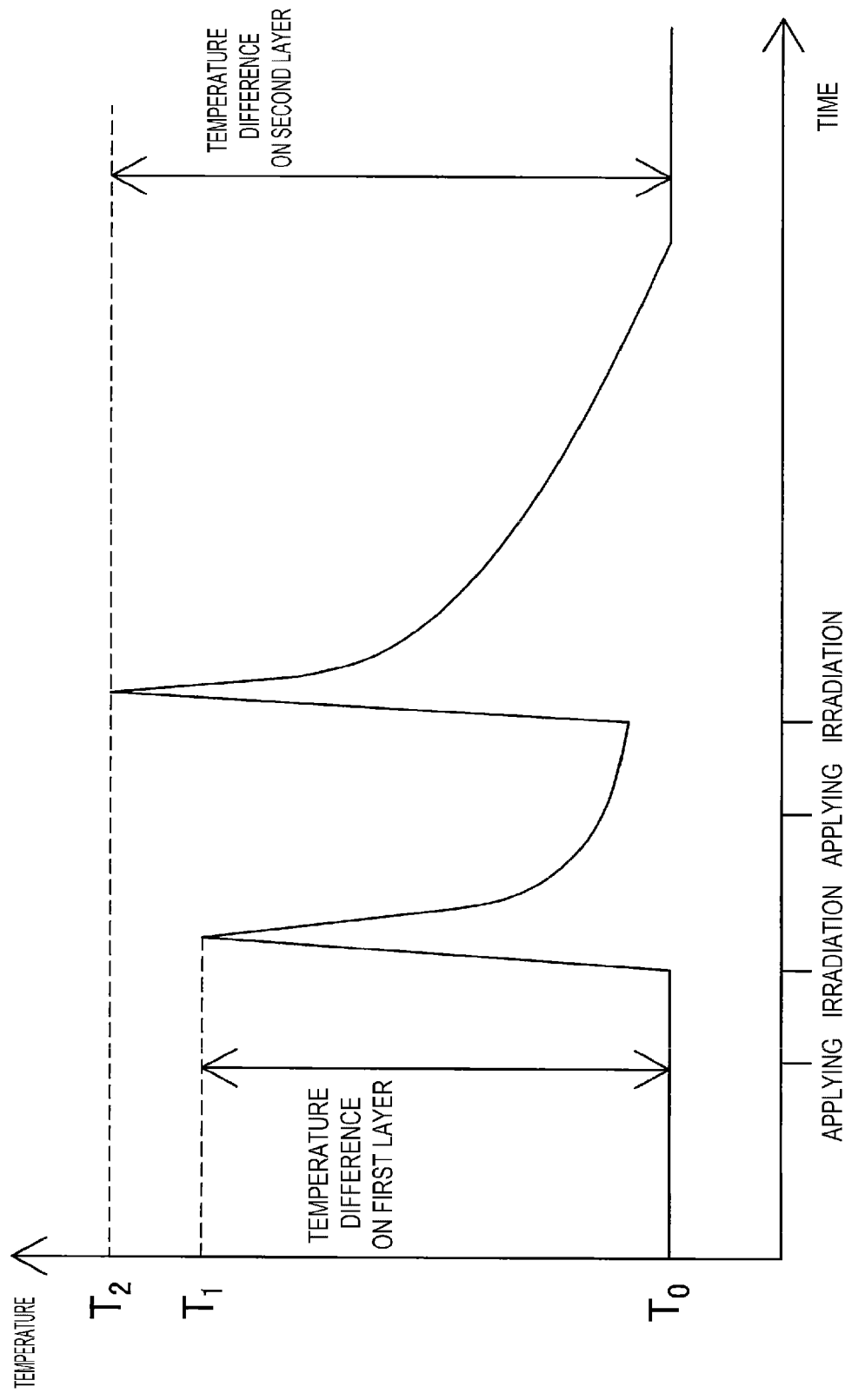
FIG. 6 is a graph illustrating a temperature change of the ultraviolet curable resin when the resin laminate is formed by the method in the conventional art.

In addition, the temperature difference between the ultraviolet curable resin when irradiated with ultraviolet rays (hereinafter, referred to as a "temperature difference when irradiated") is a difference between an ordinary temperature of the ultraviolet curable resin and the temperature of the ultraviolet curable resin when irradiated with ultraviolet rays. Specifically, the ordinary temperature of the ultraviolet curable resin is the temperature of the ultraviolet curable resin in a state of being not cooled or heated, and is substantially the same as the room temperature in an environment where circuit formation device 10 is disposed, for example, in a room. As illustrated in FIG. 5, by irradiating the ultraviolet curable resin at ordinary temperature $T_0$ with ultraviolet rays having a required integrated amount of light at once, the ultraviolet curable resin is cured to form resin layer 132. At this time, the temperature of the cured ultraviolet curable resin, that is, resin layer 132 rises to $T_1$. Incidentally, temperature $T_1$ of the cured ultraviolet curable resin, that is, temperature $T_1$ of the ultraviolet curable resin when irradiated with ultraviolet rays having the required integrated amount of light is 100° C. or higher. At this time, the temperature of board 70 is also 100° C. or higher. The temperature between resin layer 132 and board 70 increased to 100° C. or higher is reduced to ordinary temperature $T_0$ by heat dissipation. At this time, the larger the temperature difference between ordinary temperature $T_0$ of the ultraviolet curable resin and temperature $T_1$ of the ultraviolet curable resin when irradiated with ultraviolet rays, that is, the larger the temperature difference when irradiated, the larger the difference in shrinkage between resin layer 132 and board 70, and there is a possibility that a large warp may occur in resin layer 132. In FIG. 2, the temperature change of the ultraviolet curable resin when two resin layers 132 are formed is illustrated. That is, the temperature change of the ultraviolet curable resin when the formation of resin layer 132 by the applying of the ultraviolet curable resin and the curing of the ultraviolet curable resin is performed twice is illustrated.

In addition, when resin laminate 130 is formed, the ultraviolet curable resin is applied on resin layer 132 before temperature $T_1$ of the ultraviolet curable resin when irradiated with ultraviolet rays is reduced to ordinary temperature $T_0$, and the ultraviolet curable resin may be irradiated with ultraviolet rays. In such a case, the temperature difference when irradiated for forming resin layer 132 increases, and there is a possibility that a further large warp may occur in resin layer 132.

That is, in FIG. 5, after resin layer 132 on a first layer is formed, temperature $T_1$ of the ultraviolet curable resin when irradiated with ultraviolet rays is reduced to ordinary temperature $T_0$, an ultraviolet curable resin on a second layer is applied on resin layer 132 on the first layer, and the ultraviolet curable resin on the second layer is irradiated with ultraviolet rays. At this time, the temperature difference when irradiated for forming resin layer 132 on the first layer is substantially the same as the temperature difference when irradiated for forming resin layer 132 on a second layer.

On the other hand, in FIG. 3, before resin layer 132 on the first layer is formed and temperature $T_1$ of the ultraviolet curable resin when irradiated with ultraviolet rays is reduced to ordinary temperature $T_0$, the ultraviolet curable resin on the second layer is applied on resin layer 132 on the first layer, and the ultraviolet curable resin on the second layer is irradiated with ultraviolet rays. At this time, the temperature difference when irradiated for forming resin layer 132 on the second layer is larger than the temperature difference when irradiated for forming resin layer 132 on the first layer, and there is a possibility that a further large warp may occur in resin layer 132. When resin layer 132 is formed, resin layer 132 and board 70 are separated from each other due to a large warp of resin layer 132, and the shaping accuracy of resin layer 132 is reduced. In addition, in a case where resin layer 132 is aligned to a large extent, there is a possibility that ink jet head 88 or the like may come in contact with a portion of resin layer 132 that warps upward when resin layer 132 is formed. In addition, in order to suppress the separation of resin layer 132 from board 70 due to the warpage, the adhesion of resin layer 132 to board 70 is enhanced and the selection of the raw material of the ultraviolet curable resin is limited. At this time, when resin layer 132 is separated in a state where the adhesion of resin layer 132 to board 70 is high, the mechanical stress on board 70 is significantly increased. In other words, the shaping accuracy of resin laminate 130 during the formation of resin layer 132 is also reduced.

In view of this fact, in circuit formation device 10, cooling device 66 is disposed on base plate 60, and the ultraviolet curable resin is irradiated with ultraviolet rays while base plate 60 is cooled by cooling device 66. At this time, cooling device 66 cools base plate 60 so that the temperature difference when irradiated is within a set temperature. The set temperature here is set based on the difference between the expansion coefficient of resin layer 132 and the expansion coefficient of board 70.

Specifically, the amount of warpage of resin laminate 130 when forming resin laminate 130 is indexed by the warpage radius of the portion where the warpage of resin laminate 130 occurs. The warpage radius of the portion where the warpage of resin laminate 130 occurs is the radius of the circular arc in a case where the portion where the warpage of resin laminate 130 occurs is the circular arc, and is also referred to as a radius of curvature. Allowable value R is set for the amount of warpage of resin laminate 130, and in a case where the thickness of resin laminate 130 is L, the acceptance of resin laminate 130 is determined according to the following equation.

$$Y = L/(R \times X)$$

Y is a temperature difference between the ultraviolet curable resin when irradiated with ultraviolet rays, that is, a temperature difference when irradiated, and X is a difference between the expansion coefficient of resin layer 132 and the expansion coefficient of board 70 (hereinafter, referred to as a "difference in expansion coefficient").

Figure 7:
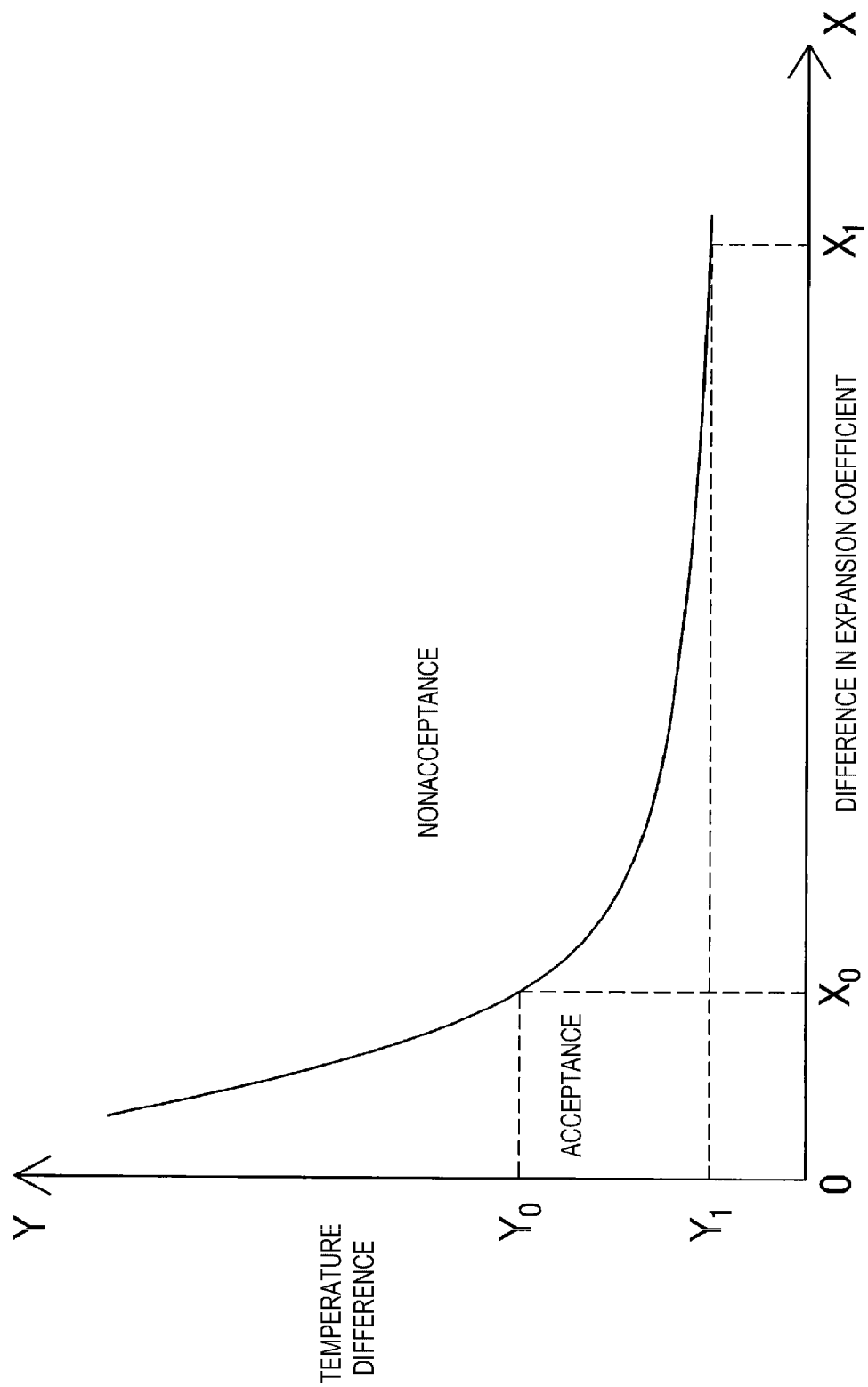
FIG. 7 is a graph illustrating a relationship between a difference in expansion coefficient and a temperature difference of the ultraviolet curable resin when irradiated with ultraviolet rays.

Here, when the above equation is illustrated in a graph, a curve as illustrated in FIG. 7 is obtained. A region below the curve is an acceptable region, and a region above the curve is a nonacceptable region. Therefore, for example, in a case where the difference in expansion coefficient is $X_0$, a set temperature difference is set so as to be smaller than $Y_0$. That is, for example, in a case where $Y_0$ is 60° C., the set temperature difference is set to 50° C. In a case where the set temperature difference is set to 50° C., base plate 60 is cooled so that the temperature difference of the ultraviolet curable resin when irradiated with ultraviolet rays is within 50° C.

Specifically, for example, in a case where the ordinary temperature of the ultraviolet curable resin is 25° C. and the temperature of the ultraviolet curable resin when irradiated with ultraviolet rays in a state where base plate 60 is not cooled is 125° C., the temperature of the ultraviolet curable resin is increased by 100° C. by the irradiation of ultraviolet rays. That is, the elevated temperature of the ultraviolet curable resin by the irradiation of ultraviolet rays is 100° C. Therefore, when base plate 60 is cooled to minus 25° C., the ultraviolet curable resin applied to board 70 is also cooled via board 70, and thus the temperature of the ultraviolet curable resin when irradiated with ultraviolet rays is 75° C. even when the elevated temperature of the ultraviolet curable resin is 100° C. At this time, the difference between the temperature of the ultraviolet curable resin (75° C.) when irradiated with ultraviolet rays and the ordinary temperature of the ultraviolet curable resin (25° C.), that is, the temperature difference when irradiated is 50° C., which is within the set temperature difference. As described above, by cooling base plate 60 so that the temperature difference when irradiated is within the set temperature, the ultraviolet curable resin when irradiated with ultraviolet rays is also cooled, and the amount of warpage of resin laminate 130 is within the range of allowable value R even in a case where warpage occurs in resin laminate 130. As a result, it is possible to suitably suppress the amount of warpage of resin laminate 130 when irradiated with ultraviolet rays.

However, there is a case where base plate 60 cannot be cooled to minus 25° C. due to the performance of cooling device 66. In such a case, the ultraviolet curable resin is not irradiated with ultraviolet rays having the required integrated amount of light at once, the ultraviolet curable resin is separately irradiated with ultraviolet rays through multiple steps, and the integrated amount of light of ultraviolet rays by multiple steps is defined as the required integrated amount of light.

Specifically, the number of times of irradiating ultraviolet rays to be separately irradiated through multiple steps is determined based on the performance of cooling device 66 and the set temperature difference. Here, the performance of cooling device 66 is a lower limit value of the cooling temperature of base plate 60 by cooling device 66, and cooling device 66 can cool base plate 60 to 5° C. In addition, the set temperature difference is calculated based on the difference in expansion coefficient as described above. In the above description, the set temperature difference is set to 50° C., which is a temperature lower than $Y_0$, based on the difference in expansion coefficient $X_0$, and in this description, the set temperature difference is set to 0° C., which is a temperature lower than $Y_1$ (refer to FIG. 7), based on the difference in expansion coefficient $X_1$ (refer to FIG. 7) having a significantly large value. Therefore, it is necessary to cool base plate 60 so that the temperature of the ultraviolet curable resin when irradiated with ultraviolet rays is kept at an ordinary temperature (25° C.) of the ultraviolet curable resin.

On the other hand, as described above, the lower limit value of the cooling temperature of base plate 60 by cooling device 66 is 5° C., and base plate 60 cannot be cooled to a temperature lower than 5° C. Therefore, in board 70 placed on base plate 60 cooled to 5° C., when the ultraviolet curable resin applied on board 70 is irradiated with ultraviolet rays, in order to set the temperature of the ultraviolet curable resin to the ordinary temperature (25° C.) of the ultraviolet curable resin, it is necessary to keep the elevated temperature of the ultraviolet curable resin when irradiated with ultraviolet rays at 20° C. However, as described above, the elevated temperature of the ultraviolet curable resin in a case where the ultraviolet curable resin is collectively irradiated with ultraviolet rays having the required integrated amount of light at once is 100° C. Therefore, it is necessary to separately irradiate the ultraviolet curable resin with ultraviolet rays through multiple steps so that the elevated temperature of the ultraviolet curable resin when irradiated with ultraviolet rays is ⅕ temperature (20° C.) of the elevated temperature (100° C.) of the ultraviolet curable resin when irradiated with ultraviolet rays having the required integrated amount of light.

Here, in order to simplify the description, for example, it is assumed that the elevated temperature of the ultraviolet curable resin in a case where the ultraviolet curable resin is irradiated with the ultraviolet ray having the amount of light of ½ of the required integrated amount of light is ½ of the elevated temperature (100° C.) of the ultraviolet curable resin when irradiated with the ultraviolet ray having the required integrated amount of light. That is, it is assumed that the elevated temperature of the ultraviolet curable resin in a case where the ultraviolet curable resin is irradiated with ultraviolet rays having the amount of light of 1/X of the required integrated amount of light is 1/X of the elevated temperature (100° C.) of the ultraviolet curable resin when irradiated with ultraviolet rays having a required integrated amount of light. Under such an assumption, in order to set the elevated temperature of the ultraviolet curable resin when irradiated with ultraviolet rays to ⅕ temperature (20° C.) of the elevated temperature (100° C.) of the ultraviolet curable resin when irradiated with ultraviolet rays having the required integrated amount of light, the amount of light when irradiated with ultraviolet rays may be set to ⅕ of the required integrated amount of light. In a case where the amount of light when irradiated with ultraviolet rays is set to be ⅕ of the required integrated amount of light, it is necessary to irradiate ultraviolet rays having the amount of light of ⅕ of the required integrated amount of light five times in order to cure the ultraviolet curable resin, that is, to irradiate the ultraviolet curable resin with ultraviolet rays having a required integrated amount of light. As a result, the number of times of irradiating ultraviolet rays to be separately irradiated through multiple steps is determined to be five times.

Figure 8:
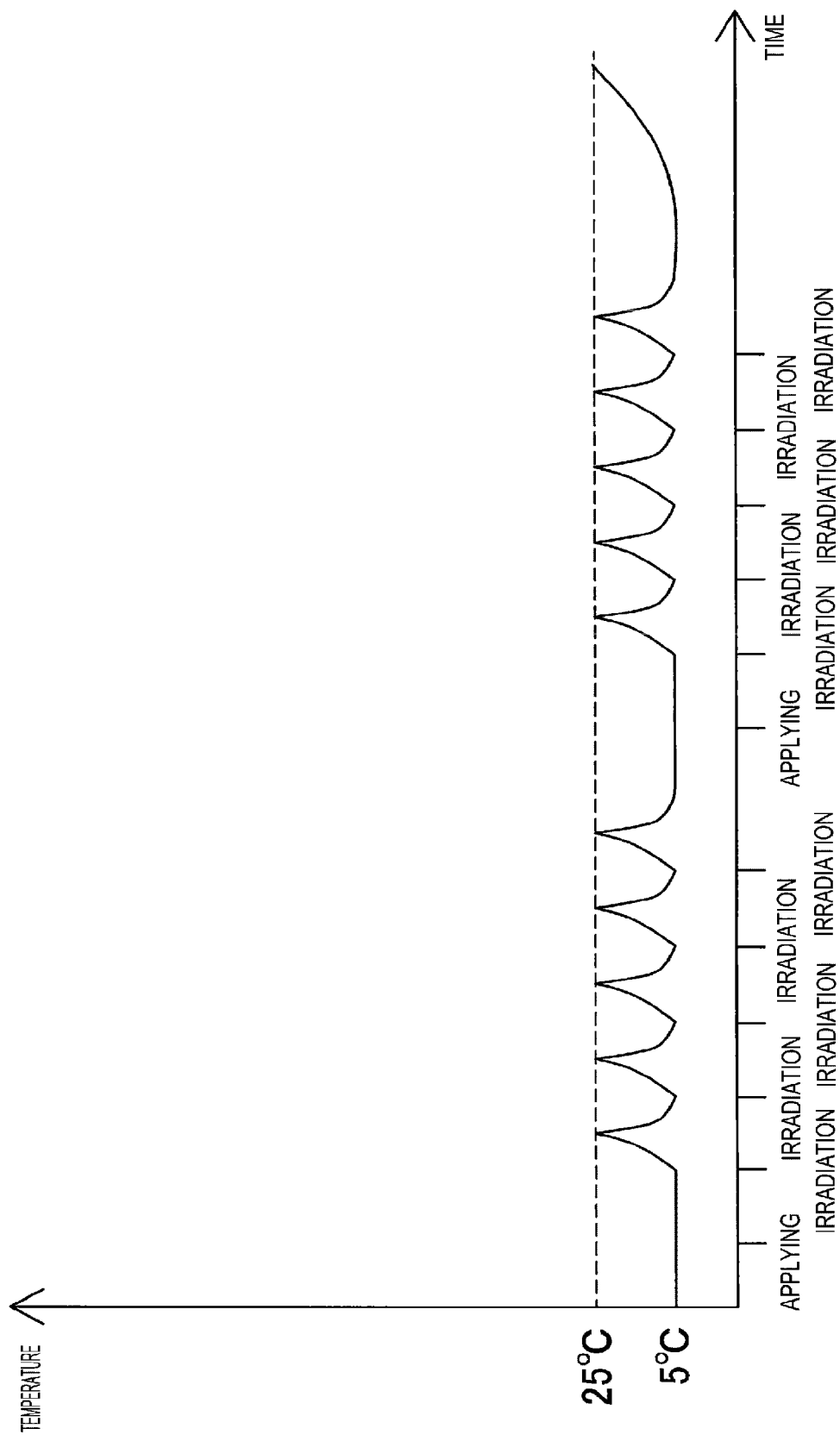
FIG. 8 is a graph illustrating a temperature change of an ultraviolet curable resin when a resin laminate is formed by a method of the present disclosure.

As described above, when the number of times of irradiating with ultraviolet rays to be separately irradiated through multiple steps is determined, base plate 60 is cooled to 5° C. so that the difference between the temperature of the ultraviolet curable resin when irradiated with ultraviolet rays and the ordinary temperature (25° C.) of the ultraviolet curable resin is within the set temperature difference (0° C.). That is, base plate 60 is cooled to 5° C. so that the temperature of the ultraviolet curable resin when irradiated with ultraviolet rays is the ordinary temperature (25° C.) of the ultraviolet curable resin. Ultraviolet rays having the required integrated amount of light are separately irradiated five times. That is, the ultraviolet curable resin is irradiated with ultraviolet rays having the amount of light of ⅕ of the required integrated amount of light at once, and the irradiation of ultraviolet rays is repeated five times. As a result, as illustrated in FIG. 8, in base plate 60 cooled to 5° C., the temperature of the ultraviolet curable resin rises by 20° C. each time the ultraviolet curable resin applied to board 70 is irradiated with ultraviolet rays once. Therefore, the temperature of the ultraviolet curable resin when irradiated with ultraviolet rays is the ordinary temperature (25° C.) of the ultraviolet curable resin, and the temperature difference between the ultraviolet curable resin when irradiated with ultraviolet rays is within the set temperature difference (0° C.). As described above, even in a case where cooling device 66 can only cool base plate 60 to 5° C., by separately irradiating the ultraviolet curable resin with ultraviolet rays through multiple steps, the temperature difference between the ultraviolet curable resin when irradiated with ultraviolet rays can be within the set temperature difference (0° C.), and the amount of warpage of the resin laminate can be suitably suppressed.

Incidentally, in the above embodiment, circuit formation device 10 is an example of the cured resin formation device. Board 70 is an example of a base. Ink jet head 88 is an example of an applying device. Irradiation device 92 is an example of an irradiation device.

The present disclosure is not limited to the embodiment described above, and can be implemented in various embodiments with various modifications and improvements based on the knowledge of those skilled in the art. For example, although the set temperature difference is set to 0° C. in the above embodiment, any temperature can be set as long as the temperature is lower than $Y_1$ (refer to FIG. 7) corresponding to the difference in expansion coefficient $X_1$ (refer to FIG. 7).

In addition, in the above embodiment, although the ultraviolet curable resin is indirectly cooled by cooling device 66, that is, through base plate 60 and board 70, the ultraviolet curable resin may be directly cooled. For example, a blowing device may be disposed above base plate 60, and the ultraviolet curable resin may be directly cooled by blowing air by the blowing device toward the ultraviolet curable resin applied on board 70.

In addition, in the above embodiment, wiring 136 formed on resin laminate 130 is formed by drying metal ink 134 by ultraviolet irradiation device 78, and may be formed by overheating metal ink 134 by a heating furnace or the like. In addition, wiring 136 may be formed by firing metal ink 134 by a laser irradiation device.

In addition, although the present disclosure is applied to circuit formation device 10 and the method of forming a circuit in the above embodiment, the present disclosure may be applied to a formation device and a method of forming a 3D shaped object such as a figure as long as the object is formed by curing an ultraviolet curable resin.

REFERENCE SIGNS LIST

10: circuit formation device (cured resin formation device), 70: board (base), 88: ink jet head (applying device), 92: irradiation device

The invention claimed is:

1. A cured resin formation method comprising:
   an applying step of applying an ultraviolet curable resin on a base; and
   a curing step of curing the ultraviolet curable resin by irradiating the ultraviolet curable resin applied in the applying step with ultraviolet rays, wherein
   in the curing step, the ultraviolet curable resin is irradiated with ultraviolet rays while cooling the ultraviolet curable resin, so that a difference between an ordinary temperature of the ultraviolet curable resin and a temperature of the ultraviolet curable resin when irradiated with ultraviolet rays is within a set temperature difference set in advance, and
   the set temperature difference is set based on an expansion coefficient of the base and an expansion coefficient of the ultraviolet curable resin.

2. The cured resin formation method according to claim 1, wherein
   in the curing step, the ultraviolet curable resin is cured by irradiating the ultraviolet curable resin applied in the applying step with ultraviolet rays through multiple steps so that an integrated amount of light of ultraviolet rays through multiple steps is a required integrated amount of light, which is an amount of light required to cure the ultraviolet curable resin.

3. The cured resin formation method according to claim 2, wherein
   the number of times of irradiation with ultraviolet rays in the curing step is determined based on an expansion coefficient of the base, an expansion coefficient of the ultraviolet curable resin, and the set temperature difference.

4. A cured resin formation device comprising:
   an applying device configured to apply an ultraviolet curable resin on a base; and
   an irradiation device configured to cure the ultraviolet curable resin by irradiating the ultraviolet curable resin applied by the applying device with ultraviolet rays, wherein
   the irradiation device irradiates the ultraviolet curable resin with ultraviolet rays while cooling the ultraviolet curable resin so that a difference between an ordinary temperature of the ultraviolet curable resin and a temperature of the ultraviolet curable resin when irradiated with ultraviolet rays is within a set temperature difference set in advance, and
   the set temperature difference is set based on an expansion coefficient of the base and an expansion coefficient of the ultraviolet curable resin.

* * * * *